United States Patent [19]

Hunter et al.

[11] Patent Number: 5,723,391
[45] Date of Patent: Mar. 3, 1998

[54] SILICON CARBIDE GEMSTONES

[75] Inventors: Charles Eric Hunter, Raleigh; Dirk Verbiest, Carrboro, both of N.C.

[73] Assignee: C3, Inc., Morrisville, N.C.

[21] Appl. No.: 739,784

[22] Filed: Oct. 30, 1996

Related U.S. Application Data

[62] Division of Ser. No. 521,635, Aug. 31, 1995.

[51] Int. Cl.[6] .................... C30B 29/36; C04B 35/565
[52] U.S. Cl. .................... 501/86; 501/88; 63/32; 117/951
[58] Field of Search .................... 63/32; 501/86, 501/88; 117/951

[56] References Cited

U.S. PATENT DOCUMENTS

| | | | |
|---|---|---|---|
| Re. 34,861 | 2/1995 | Davis et al. | 437/100 |
| 988,230 | 3/1911 | Verneuil. | |
| 1,004,505 | 9/1911 | Verneuil. | |
| 1,745,607 | 2/1930 | D'Esposito. | |
| 2,488,507 | 11/1949 | Burdick et al. | |
| 2,690,062 | 9/1954 | Burdick et al. | |
| 2,690,630 | 10/1954 | Eversole et al. | |
| 2,913,313 | 11/1959 | Schroll. | |
| 2,941,248 | 6/1960 | Hall. | |
| 2,947,609 | 8/1960 | Strong. | |
| 2,947,610 | 8/1960 | Hall et al. | |
| 3,025,192 | 3/1962 | Lowe. | |
| 3,174,827 | 3/1965 | Wakelyn et al. | |
| 3,297,407 | 1/1967 | Wentorf, Jr. | |
| 3,317,035 | 5/1967 | Cannon. | |
| 3,423,177 | 1/1969 | Bovenkerk. | |
| 3,485,591 | 12/1969 | Evans et al. | |
| 3,630,678 | 12/1971 | Gardner. | |
| 3,630,679 | 12/1971 | Angus. | |
| 3,897,529 | 7/1975 | Carr et al. | |
| 3,912,521 | 10/1975 | Cline et al. | |
| 3,950,596 | 4/1976 | Carr et al. | |
| 3,959,527 | 5/1976 | Droege. | |
| 4,030,317 | 6/1977 | Rogell. | |
| 4,034,066 | 7/1977 | Strong et al. | |
| 4,039,726 | 8/1977 | Carr et al. | |
| 4,042,673 | 8/1977 | Strong. | |
| 4,073,380 | 2/1978 | Strong et al. | |
| 4,193,975 | 3/1980 | Kotval et al. | |
| 4,262,497 | 4/1981 | Morris et al. | |
| 4,287,168 | 9/1981 | Wentorf, Jr. et al. | |
| 4,301,134 | 11/1981 | Strong. | |
| 4,322,396 | 3/1982 | Strong. | |
| 4,490,440 | 12/1984 | Reber. | |
| 4,547,258 | 10/1985 | Witter et al. | |
| 4,632,817 | 12/1986 | Yazu et al. | |
| 4,662,348 | 5/1987 | Hall et al. | |
| 5,015,499 | 5/1991 | Carbone. | |
| 5,202,105 | 4/1993 | Boecker et al. | |
| 5,230,768 | 7/1993 | Furukawa et al. | |
| 5,441,011 | 8/1995 | Takhashi et al. | 117/84 |

OTHER PUBLICATIONS

Hurlbut, Cornelius S. and Kammerling, Robert C. (1991) Gemology 2nd Edition, John Wiley: New York. pp. 309–324 no month.

Faust, J.W., Campbell, R.B., Choyke, W.J., and Patrick, L. (1973) Tables of Data on Silicon Carbide, Appendix II, Conference Proceedings from the Executive and Program Committees of the International Conference on Silicon Carbide–1973 no month.

Mandelung, O. (Ed.). (1991) Semiconductor: Group IV Elements and III–V Compounds. In: Data in Science and Technology, Poerschke, R. (Ed. in Chief). Springer–Verlag, Berlin, Heidelberg, New York pp. 47–57 no month.

Landolt–Borstein. (1982). Physics of Group IV Elements and III–V Compounds. New Series, Group III. vol. 17. Berlin, Heidelberg, New York. pp. 133–142 and 403–591 no month.

Burgemeister, E.A. von Muench, W. and Pettenpaul, E. (1979) Thermal Conductivity and Electrical Properties of 6H Silicon Carbide. Journal of Applied Physics. 50(9) 5790–5794 no month.

O'Dohoghue, M. (1983) A Guide to Man–made Gemstones, Van Nostrand Reinhold: New York., p. 207 no month.

Nassau, K. (1980). Gems Made by Man, Gemological Institute of America, Santa Monica, California, pp. 252–253 no month.

Gemological Institute of America. (1989). The GIA Jeweler's Manual, 3rd Edition. Santa Monica, CA: GIA. pp. 241–245 no month.

Gemological Institute of America. (1994). Colored Stone Course, Assignment 1: Course Introduction. Santa Monica, CA: GIA. pp. 9–17 no month.

Gemological Institute of America. (1994). Colored Stone Course, Assignment 7: Fashioning Styles. Santa Monica, CA: GIA pp. 5–13 no month.

Gemological Institute of America. (1994). Colored Stone Course, Assignment 17: Fashioning Processes. Santa Monica, CA: GIA. pp. 12–16 no month.

*Primary Examiner*—Karl Group
*Attorney, Agent, or Firm*—Richard S. Faust

[57] ABSTRACT

Synthetic gemstones having extraordinary brilliance and hardness are formed from large single crystals of relatively low impurity, translucent silicon carbide of a single polytype that are grown in a furnace sublimation system. The crystals are cut into rough gemstones that are thereafter fashioned into finished gemstones. A wide range of colors and shades is available by selective doping of the crystal during growth. A colorless gemstone is produced by growing the crystal undoped in a system substantially free of unwanted impurity atoms.

17 Claims, 1 Drawing Sheet

SILICON CARBIDE GEMSTONES

This is a division of application Ser. No. 08/521,635, filed Aug. 31, 1995.

FIELD OF THE INVENTION

The invention relates to synthetic gemstones. More particularly, the invention relates to synthetic gemstones formed of translucent, monocrystalline silicon carbide.

BACKGROUND OF THE INVENTION

Gemstones Generally:

There are a limited number of elements and chemical compounds that have the physical characteristics to be useful as gemstones. The physical characteristics that are generally accepted as being most important are hardness, refractive index and color, although thermal stability, chemical stability and toughness are also considered important in many gemstone applications.

To date, the only chemical substances technically considered precious stones are diamond (single crystalline carbon) and corundum (sapphire and ruby [single crystalline aluminum oxide]) because their hardness when measured on the Mohs scale is approximately 9 or higher. The Mobs system is a scale for ranking hardness of a mineral with diamond being the hardest at 10, sapphire at 9, topaz 8 down to the softest mineral, talc, which is 1. Emerald, because it is rare, is accepted as a precious stone even though its hardness is 7.5 while other gems, such as chrysoberyl, topaz and garnet, are usually classified as semiprecious stones because of their lower hardness. Hardness has practical value in that it defines the ability of a gemstone to resist scratching.

Refractive index is important because it defines the ability of a gemstone to refract light. When materials with a high refractive index are fashioned into finished gemstones they sparkle and appear brilliant when exposed to light. The characteristic sparkle of a diamond is due mainly to its high refractive index.

The color of a gemstone is determined by a variety of factors, from the impurity atoms that are available to be incorporated into the crystal lattice to the physical and electronic structure of the crystal itself. A ruby, for instance, is simply a sapphire crystal (aluminum oxide) that contains a small concentration of chromium impurity atoms.

The thermal and chemical stability of a gemstone can be important during the process of mounting stones into jewelry. In general, it is beneficial if stones can be heated to high temperatures without changing color or reacting with ambient gases (that mar the surface finish).

The toughness of a gemstone relates to the ability of the gemstone to absorb energy without breaking, chipping or cracking. A gemstone must be able to withstand those impact forces normally encountered during a lifetime of use mounted on a ring or other jewelry item.

Hardness, refractive index, color, thermal/chemical stability and toughness are all characteristics that, in combination, determine the usefulness of a material as a gemstone.

Synthetic Diamond Gemstones:

Dating from the 1960s, an effort to produce gem-quality synthetic diamonds was pursued by General Electric Company as evidenced by numerous patents, including U.S. Pat. No. 4,042,673. These efforts centered around the use of very high pressure/high temperature environments for growth of monocrystalline diamonds on seed crystals. Gem-quality synthetic diamonds generally have not gained commercial acceptance.

Synthetic Silicon Carbide Used As Abrasives And Semiconductor Materials:

Silicon carbide is rarely found in nature. However, it has been manufactured for more than eighty years, in crystalline form, for abrasive products. Silicon carbide crystals found in nature and in abrasive products are black and not translucent because they contain substantial levels of impurity atoms.

During the 1960s and 1970s, significant development activities were initiated with the objective of growing large (bulk) crystals of low impurity silicon carbide for use in the production of semiconductor devices. These efforts finally resulted in the commercial availability of relatively low impurity, translucent silicon carbide crystals in 1990. These silicon carbide crystals are only fabricated and marketed as very thin, green or blue (175 um–400 um) slices useful for semiconductor devices.

Silicon carbide has a very high hardness (8.5–9.25 Mohs depending on the polytype [atomic arrangement] and crystallographic direction) and a high refractive index (2.5–2.71 depending on the polytype). Furthermore, silicon carbide is a very tough material and an extremely stable material that can be heated to more than 2000° F., in air, without suffering damage.

Silicon carbide is a complex material system that forms more than 150 different polytypes, each having different physical and electronic properties. The different polytypes can be classified in three basic forms, cubic, rhombohedral and hexagonal. Both the rhombohedral and hexagonal forms can occur in a number of different atomic arrangements that vary according to atomic stacking sequence.

SUMMARY OF THE INVENTION

The present invention, in one broad aspect, is the discovery that relatively low impurity, translucent, single crystal silicon carbide—presently used as the material for fabrication of very thin semiconductor devices—may be grown with desired color and thereafter cut, faceted and polished into synthetic finished gemstones having (i) a hardness approaching that of diamond, (ii) excellent toughness, (iii) excellent thermal/chemical stability, and (iv) a high refractive index that renders the silicon carbide gemstone as brilliant, if not more brilliant, than diamond. According to this aspect of the invention, a single crystal of silicon carbide, preferably of consistent color, is grown by an appropriate technique such as the sublimation technique disclosed in U.S. Pat. No. Re. 34,861. Instead of slicing the large crystal into many thin slices, the crystals serve as boules that are cut into rough synthetic gemstones having a weight on the order of, for example, ¼ to 5 carats. The rough gemstones thereafter are fashioned into finished synthetic silicon carbide gemstones. The faceting and polishing techniques are derived from those techniques currently used in connection with the faceting and polishing of colored gemstones such as rubies and sapphire, incorporating certain procedures utilized in connection with diamonds.

As mentioned above, preferably the single crystals of silicon carbide are grown under the same or similar conditions that are used to produce crystals having the low impurity levels necessary for semiconductor applications, with it being appreciated, of course, that higher impurity levels may be permissible within accepted ranges consistent with the need for materials having suitable translucence and other optical properties for gemstone use.

Silicon carbide crystals can be grown in a wide range of colors (including green, blue, red, purple, yellow, and black) and shades within each color by the appropriate selection of dopants (e.g., nitrogen and aluminum) and by varying the net doping densities (concentrations). Undoped silicon carbide crystals in the hexagonal or rhombohedral forms are colorless and meet, or exceed, the brilliance of diamond.

Rough silicon carbide gemstones are cut from large single crystals and then fashioned into finished gemstones by a combination of techniques currently employed in connection with conventional colored gemstones and diamonds. The hardness and toughness of silicon carbide permit the stones to be faceted with very sharp edges, thus enhancing the overall appearance and brilliance of the stones.

BRIEF DESCRIPTION OF THE DRAWINGS

Some of the objects having been stated, other objects will appear as the description proceeds, when taken in connection with the accompanying drawings, in which—

DETAILED DESCRIPTION OF THE INVENTION

While the present invention will be described more fully hereinafter with reference to the accompanying drawings, in which aspects of the preferred manner of practicing the present invention are shown, it is to be understood at the outset of the description which follows that persons of skill in the appropriate arts may modify the invention herein described while still achieving the favorable results of this invention. Accordingly, the description which follows is to be understood as being a broad, teaching disclosure directed to persons of skill in the appropriate arts, and not as limiting upon the present invention.

Figure 1:
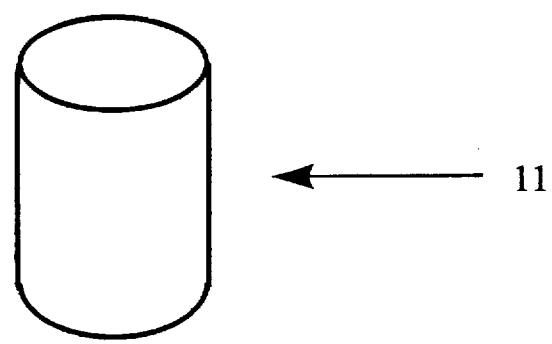
FIG. 1 is a pictorial view of a boule comprising a large single crystal of one polytype of silicon carbide.
Figure 2:
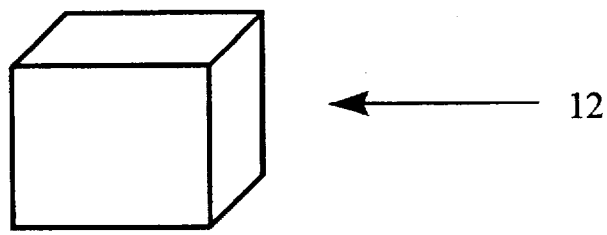
FIG. 2 is an enlarged pictorial view of a rough synthetic gemstone cut from the single crystal of FIG. 1.

Referring to the drawings, FIG. 1 shows a "boule" comprising a large single crystal 11 of silicon carbide that weighs approximately 716 carats and from which approximately 105 five carat rough synthetic gemstones (FIG. 2) may be cut. Each five carat rough gemstone, when fashioned into a finished gemstone, will yield an approximate sized gemstone on the order of two carats. Crystal 11 is substantially cylindrical and measures approximately 44 mm high and 40 mm in diameter. In the preferred manner of practicing the invention, crystal 11 is formed of a single polytype, for example, a hexagonal form such as 6H SiC, and has a low enough impurity level to render the crystal sufficiently translucent for use as a gemstone.

Crystal 11 is grown by an appropriate sublimation or deposition or other growth technique used to grow large (bulk) silicon carbide single crystals, with the preferred method being sublimation growth on a seed crystal. According to this preferred technique, crystal 11 is grown by introducing a polished monocrystalline seed crystal of silicon carbide of a desired polytype into the furnace of a sublimation system along with silicon and carbon containing source gas or powder (source material). The source material is heated to a temperature that causes the source material to create a vapor flux that deposits vaporized Si, $Si_2C$, and $SiC_2$ to the growth surface of the seed crystal. The reproducible growth of a single selected polytype on the seed crystal is achieved by maintaining a constant flux of Si, $Si_2C$ and $SiC_2$, and by controlling the thermal gradient between the source material and the seed crystal.

Crystals grown by sublimation techniques have been used as a material from which very thin slices are taken for use in the production of semiconductor devices. These slices (175 um–400 um) have been green or blue, like the crystal, with the color (and desired electrical properties) achieved by intentionally doping with selected dopants at selected concentrations during the growth process.

Undoped (intrinsic) silicon carbide has not been grown commercially. The extremely low electrical conductivity of undoped silicon carbide would give it no practical value in the fabrication of semiconductor products. However, it has been found that because the hexagonal and rhombohedral polytypes of silicon carbide have wide energy band gaps (>2.7 electron volts) if they are grown undoped (or, equivalently, with a very low level of impurity atoms) the crystals will be colorless. In order to grow undoped, colorless silicon carbide single crystals, the crystal growth system is maintained substantially free of unwanted gaseous or vaporized impurity atoms that would result in unintentional doping of the crystal as it grows utilizing low pressure bake-out techniques as are well known in the art. Preferred polytypes for colorless silicon carbide gemstones are 6H and 4H SiC. The seed for initiating growth of the single crystal for such gemstones is the seed having the same polytype, 6H or 4H SiC respectively.

To create crystals of hexagonal silicon carbide having different colors, one must intentionally add specific impurity atoms. The cubic or 3C form of silicon carbide, because of its more narrow energy band gap, will appear yellow when undoped with impurity atoms. Since a large number of different atomic arrangements of silicon carbide exist (any of which can be doped with a number of different dopants in various combinations and concentrations) it is possible to produce gemstones in a wide range of colors and shades. With the 6H polytype, the dopants commonly used are nitrogen (n type) and aluminum (p type) in concentrations typically ranging from a low range on the order of $10^{15}$ carrier atoms per cubic centimeter to a high range on the order of $10^{19}$ carrier atoms per cubic centimeter. Other dopants such as boron may be used at concentrations sufficient to achieve desired colors and shades. The table below gives various atomic arrangements and dopants that produce several representative basic colors.

| Colorless | 6H SiC | Undoped |
|---|---|---|
| Colorless | 4H SiC | Undoped |
| Blue | 6H SiC | Al-doped |
| Purple | 6H SiC | High Al-doped |
| Purple | 24R SiC | N-doped |
| Green | 6H SiC | N-doped |
| Yellow | 3C SiC | Undoped |
| Yellow-Green | 3C SiC | N-doped |
| Red | 27R SiC | N-doped |
| Light Brown | 4H SiC | Low N-doped |
| Yellow-Orange | 8H SiC | N-doped |

Although the above combinations yield a wide variety of colors, all of the crystals have two very important characteristics in common, (1) high hardness and (2) high refractive index. The hardness and refractive index of silicon carbide are compared with other gemstone materials, along with a comparison of density:

|  | Mohs Hardness | Refractive Index | Density (SG) |
| --- | --- | --- | --- |
| Emerald | 7.5 | 1.59 | 2.5 |
| Corundum (sap & ruby) | 9 | 1.77 | 3.9 |
| Diamond | 10 | 2.42 | 3.5 |
| Silicon Carbide (6H) | 9 | 2.69 | 3.2 |
| Silicon Carbide (4H) | 9 | 2.71 | 3.2 |
| Cubic Zirconia | 7.5 | 1.98 | 4.7 |

As illustrated by the table above, silicon carbide, when produced in certain atomic arrangements with the controlled introduction of specific dopant atoms, is an excellent colored gemstone material that has physical characteristics comparing favorably with, or exceeding, those of corundum and emerald. In its undoped hexagonal and rhombohedral forms, silicon carbide is the best known candidate to replicate the characteristics of diamond.

Fashioning the Gemstones

Figure 3:
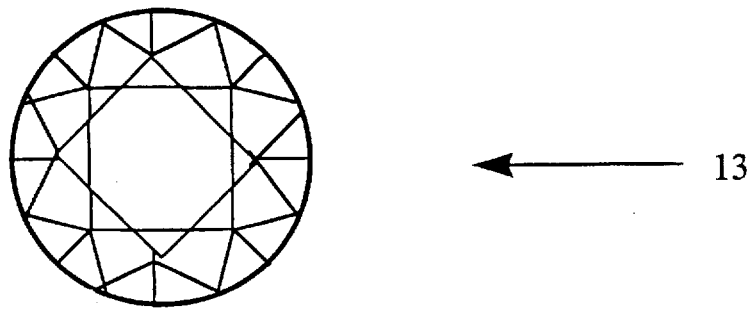
FIG. 3 is an enlarged pictorial view of a finished synthetic silicon carbide gemstone fashioned from the rough stone of FIG. 2.

Referring back to the drawings, the silicon carbide crystal 11 (FIG. 1) of perhaps 716 carats is cut into multiple rough synthetic gemstones 12 (one shown in FIG. 2) having a selected weight, for example, five carats. The rough gemstone 12 preferably has a cubic or approximately cubic shape. In order to produce a finished gemstone as illustrated in FIG. 3, it has been found desirable to fashion the rough gemstone 12 into a finished gemstone according to a novel process that is best suited to taking advantage of the physical characteristics of silicon carbide. This process incorporates faceting techniques that result in precise angles and very sharp edges to take full advantage of the toughness and hardness of the silicon carbide material, while incorporating other techniques more similar to those used on colored stones. A more complete description of the fashioning process will be set forth below following a brief discussion of fashioning, in general, and certain aspects of fashioning colored gemstones such as rubies, sapphires and emeralds.

Fashioning in General (Prior Art)

Gemstone fashioning includes four techniques: faceting, tumbling, cabbing and carving. Faceting produces flat faces (facets) on gems of many different shapes. Transparent and highly translucent gems are normally faceted. Less translucent and opaque materials are usually tumbled, cabbed or carved because the optical properties associated with faceting depend on light reflecting from inside the stone.

A gem's shape is its outline face up, the position in which it is meant to be seen when it is mounted. Shapes other than round are called fancy. Some popular fancy shapes include the well-known emerald cut, cushion, antique cushion, oval, pear, and marquis. Colored stones (and diamonds over three carats) are generally cut into fancy shapes because a lapidary can keep more weight of the original gemstone by utilizing a fancy shape, thus improving the weight yield.

The precise, standardized faceting seen in diamonds is rare in colored stones. One reason is the inability of some colored stones, because of their lower hardness and toughness, to be faceted into sharp angles without breaking or chipping. Another is the difference in what professionals and consumers expect of diamonds versus other stones. "Oriental or native cut" are terms used to describe faceted gems which have distorted shapes and irregularly placed facets and are more common on colored stones. The jewelry industry accepts not perfected faceted colored stones. Most colored stones are faceted just enough to let the light in.

Most faceted gems have three main parts: crown, girdle, and pavilion. The crown is the top part, the girdle is the narrow section that forms the boundary between the crown and pavilion; it is the gem's setting edge. The pavilion is the bottom. Colored stones usually have facets on the pavilion and crown.

The Fashioning Process in General for Colored Stones (Prior Art)

The colored gemstone faceter begins by grinding the rough colored gemstone into the approximate shape and dimensions of the finished stone. This is called preforming. Preforming takes a coarse abrasive. Diamond grit embedded in a nickel-plated copper disc is the best choice for preforming very hard colored stones (corundum, chrysoberyl, spinel and silicon carbide).

Water is the wetting agent in preforming and the rest of the faceting sequence. Lapidaries use various arrangements to keep the wheels wet. Preforming roughs in the girdle outline and the general profile of the crown and pavilion, leaving a frosted surface all around the stone. Before grinding in the facets, the lapidary needs to mount the colored stone on a dopstick. The procedure is called dopping. The stone is gently heated, then brought up against the end of the dop, which has been dipped into melted dopping wax. Once the preform has set in position, it is set aside to cool.

The facets of the colored stone are ground and polished on horizontally spinning wheels called laps. Lapidaries use a series of cutting laps with progressively finer grit to grind in the facets, gradually smoothing out their surfaces. Then they do final polishing on a special polishing lap.

Polishing laps are made from a variety of materials. The polishing agents with which these are charged are very finely ground powders, including diamond, corundum, cerium oxide, and tin oxide. To cut and polish consistently at the same desired angles, the faceter attaches the dopstick to a device that holds the stone in position as it meets the lap. The traditional setup used in many colored stone shops is the jamb peg. This has a block mounted on a vertical post. The dopstick fits into one of a series of holes on the side of the block. The position of each hole sets a specific angle (from the girdle plane) at which the facet is cut. Turning the dopstick in the hole places all the facets of a given type at the same angle in their circuit around the stone.

The Fashioning Process for Silicon Carbide Gemstones

Because the beauty of most diamonds depends on sparkle, brilliance, and fire (not color), diamond cutters must carefully control the cutting factors that affect these characteristics. It is very difficult to put diamond cuts on colored gemstones.

Because the refractive index of silicon carbide is greater than that of diamond and colored stones, according to the present invention the silicon carbide gemstone is fashioned with precision diamond cuts using diamond hand tools known as tangs. Tangs allow the cutter to set and adjust the angle of the facet, something the cutter is unable to do with colored stone hand tools which are preset. It is the precision of the diamond hand tools, tangs, that enables the cutter to use the angles and proportions of a diamond, resulting in "sharp edges" on the silicon carbide gemstones of the invention. However, because silicon carbide is not as hard as diamond, traditional colored stone lap wheels are used in the faceting process at rotational speeds less than those speeds typically used for diamond wheels, i.e., less than 3000 RPM, and preferably at rotational speeds on the order of 300 RPM.

Turning to a more particular description of the silicon carbide fashioning technique of the invention, the silicon carbide rough gemstone is mounted on a dopstick and secured within the top tang. The edge Girdle is cut first on the grinding wheel. This determines the shape of the stone.

The Table, the flat top which is the biggest facet on the whole stone, is cut next also using the table tang. The Table is then polished using a four-step process of laps (disks, wheels or sciaves) progressing from rough to smooth grit sizes. Polishing may begin with 600 a grit lap moving to 1200 grit, then to 3000 grit and ending with a ceramic disk having an effective grit size of 0.5 to 1 micron, which is the smoothest.

The dop is then transferred to a top tang to cut the top side and make the Crosswork which consists of 4 Basics (facets). Then the dop is transferred to a bottom tang and the bottom side is cut into the Crosswork which consists of 4 Basics (facets). At this time, the stone is examined by visual inspection to determine its precision. After this inspection, the 4 lap polishing process outlined for the Table is repeated for the Basics.

The dop is transferred to the top tang and the top side Star facets—there are 8 of these cut along with the Upper Girdle Facets (16 facets). The dop is transferred to the bottom tang and Lower Girdle Facets (16 facets) are cut. The 4 lap polishing process outlined for the Table and Basics is repeated for the remaining Girdle facets. The rough is now a faceted and polished round brilliant gemstone 13 as shown in FIG. 3.

While the invention has been described in connection with certain illustrated embodiments, it will he appreciated that modifications may he made without departing from the true spirit and scope of the invention.

That which is claimed is:

1. A finished synthetic silicon carbide gemstone comprising a single crystal of synthetic silicon carbide having facets polished to a degree sufficient to permit the introduction of light into the gemstone for internal reflection from inside the gemstone.

2. The finished synthetic silicon carbide gemstone of claim 1 wherein the synthetic silicon carbide has a crystalline structure selected from the group consisting of 6H SiC and 4H SiC.

3. A simulated diamond gemstone comprising a single crystal of colorless, synthetic silicon carbide having facets polished to a degree sufficient to permit the introduction of light into the gemstone for internal reflection from inside the gemstone.

4. The simulated diamond gemstone of claim 3 wherein said facets are characteristic of a diamond cut.

5. The simulated diamond gemstone of claim 4 wherein said diamond cut is a round brilliant cut.

6. The simulated diamond gemstone of claim 3 wherein the synthetic silicon carbide has a crystalline structure selected from the group consisting of 6H SiC and 4H SiC.

7. The simulated diamond gemstone of claim 6 wherein the colorless synthetic silicon carbide crystal is intrinsic silicon carbide.

8. A finished synthetic silicon carbide gemstone having a color comprising a single crystal of synthetic silicon carbide containing dopant atoms at a concentration sufficient to produce a visibly discernable color, said gemstone having facets polished to a degree sufficient to permit the introduction of light into the gemstone for internal reflection from inside the gemstone.

9. The finished synthetic silicon carbide gemstone of claim 8 having color, crystalline structure and doping characteristics selected from the group consisting of:

| Color | Crystalline Structure | Doping Characteristics |
|---|---|---|
| Blue | 6H SiC | Al-doped |
| Purple | 6H SiC | High Al-doped |
| Purple | 24R SiC | N-doped |
| Green | 6H SiC | N-doped |
| Yellow | 3C SiC | Undoped |
| Yellow-Green | 3C SiC | N-doped |
| Red | 27R SiC | N-doped |
| Light Brown | 4H SiC | Low N-doped |
| Yellow-Orange | 8H SiC | N-doped. |

10. The finished synthetic silicon carbide gemstone of claim 8 wherein said dopant atoms are present in the crystal of synthetic silicon carbide at a concentration in the range from about $10^{15}$ to $10^{19}$ carrier atoms per cubic centimeter.

11. The finished synthetic silicon carbide gemstone of claim 9 wherein said dopant atoms are present in the crystal of synthetic silicon carbide at a concentration in the range from about $10^{15}$ to $10^{19}$ carrier atoms per cubic centimeter.

12. The finished synthetic silicon carbide gemstone of claim 8 wherein the synthetic silicon carbide has a crystalline structure selected from the group consisting of 6H SiC and 4H SiC.

13. A simulated diamond gemstone comprising a single crystal of colorless, synthetic silicon carbide having facets polished to a degree of smoothness characteristic of finished diamond gemstones.

14. The simulated diamond gemstone of claim 13 wherein said facets are characteristic of a diamond cut.

15. The simulated diamond gemstone of claim 14 wherein said diamond cut is a round brilliant cut.

16. The simulated diamond gemstone of claim 13 wherein the synthetic silicon carbide has a crystalline structure selected from the group consisting of 6H SiC and 4H SiC.

17. The simulated diamond gemstone of claim 16 wherein the colorless synthetic silicon carbide crystal is intrinsic silicon carbide.

* * * * *

(12) EX PARTE REEXAMINATION CERTIFICATE (9368th)
United States Patent
Hunter et al.

(10) Number: US 5,723,391 C1
(45) Certificate Issued: Oct. 15, 2012

(54) SILICON CARBIDE GEMSTONES

(75) Inventors: Charles Eric Hunter, Raleigh, NC (US); Dirk Verbiest, Carrboro, NC (US)

(73) Assignee: Charles & Colvard, Ltd., Morrisville, NC (US)

Reexamination Request:
No. 90/009,929, Jul. 25, 2011

Reexamination Certificate for:
Patent No.: 5,723,391
Issued: Mar. 3, 1998
Appl. No.: 08/739,784
Filed: Oct. 30, 1996

Related U.S. Application Data

(62) Division of application No. 08/521,635, filed on Aug. 31, 1995, now Pat. No. 5,762,896.

(51) Int. Cl.
*C30B 29/36* (2006.01)
*A44C 17/00* (2006.01)
*C01B 31/36* (2006.01)
*C01B 33/00* (2006.01)
*C30B 23/00* (2006.01)
*C30B 33/00* (2006.01)

(52) U.S. Cl. .............. 501/86; 501/88; 63/32; 117/951
(58) Field of Classification Search .................. None
See application file for complete search history.

(56) References Cited

To view the complete listing of prior art documents cited during the proceeding for Reexamination Control Number 90/009,929, please refer to the USPTO's public Patent Application Information Retrieval (PAIR) system under the Display References tab.

*Primary Examiner* — Carlos N. Lopez

(57) ABSTRACT

Synthetic gemstones having extraordinary brilliance and hardness are formed from large single crystals of relatively low impurity, translucent silicon carbide of a single polytype that are grown in a furnace sublimation system. The crystals are cut into rough gemstones that are thereafter fashioned into finished gemstones. A wide range of colors and shades is available by selective doping of the crystal during growth. A colorless gemstone is produced by growing the crystal undoped in a system substantially free of unwanted impurity atoms.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-3 is confirmed.

Claims 4-17 were not reexamined.

\* \* \* \* \*